United States Patent
Ozawa

(10) Patent No.: US 7,851,892 B2
(45) Date of Patent: Dec. 14, 2010

(54) SEMICONDUCTOR MEMORY DEVICE AND METHOD FOR FABRICATING THE SAME

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 12/354,898

(22) Filed: Jan. 16, 2009

(65) Prior Publication Data

US 2009/0184366 A1     Jul. 23, 2009

(30) Foreign Application Priority Data

Jan. 17, 2008   (JP)   .............................. 2008-008507

(51) Int. Cl.
*H01L 23/58* (2006.01)
(52) U.S. Cl. .............................. 257/645; 257/E29.264; 257/E29.309
(58) Field of Classification Search ............... 257/326, 257/214, 315, 316, E29.264, E29.309, E21.423, 257/645, 651, E21.21; 438/587, 257, 258
See application file for complete search history.

(56) References Cited

U.S. PATENT DOCUMENTS

| | | | |
|---|---|---|---|
| 2001/0034135 A1* | 10/2001 | Miyakawa | .................. 438/710 |
| 2006/0237706 A1 | 10/2006 | Enda et al. | |
| 2006/0240619 A1 | 10/2006 | Ozawa et al. | |
| 2006/0267067 A1* | 11/2006 | Ishihara | ...................... 257/314 |
| 2007/0054453 A1* | 3/2007 | Buh et al. | .................... 438/261 |
| 2007/0080390 A1* | 4/2007 | Geissler et al. | ............. 257/315 |

FOREIGN PATENT DOCUMENTS

| | | |
|---|---|---|
| JP | 2006-294711 | 10/2006 |
| JP | 2006-310393 | 11/2006 |

OTHER PUBLICATIONS

Depas et al., "Definition of dielectric breakdown for ultra thin (< 2 nm) gate oxides", 1997, Solid-State Electronics, vol. 41, No. 4, pp. 725-728.*

* cited by examiner

*Primary Examiner*—Thomas L Dickey
*Assistant Examiner*—Nikolay Yushin
(74) *Attorney, Agent, or Firm*—Finnegan, Henderson, Farabow, Garrett & Dunner, L.L.P.

(57) ABSTRACT

A semiconductor memory device has a substrate having a semiconductor layer, an n-type semiconductor region formed beneath a main surface of the semiconductor layer, a plurality of cell gates being aligned at a space from each other and including a gate insulating film formed on the main surface of the semiconductor layer, a charge storage layer formed on the gate insulating film, a charge block layer formed on the charge storage layer and a control gate electrode formed on the charge block layer, an insulating film between cells formed on the main surface of the semiconductor layer between the cell gates, and a carbon accumulation region formed in the insulating film between the cells and has a maximum concentration of a carbon element in a region within 2 nm from an interface between the semiconductor layer and the insulating film between the cells.

10 Claims, 11 Drawing Sheets

SEMICONDUCTOR MEMORY DEVICE AND METHOD FOR FABRICATING THE SAME

CROSS REFERENCE TO RELATED APPLICATION

This application is based upon and claims the benefit of priority from the Japanese Patent Application No. 2008-8507, filed on Jan. 17, 2008, the entire contents of which are incorporated herein by reference.

BACKGROUND OF THE INVENTION

The present invention relates to a semiconductor memory device and a method for fabricating the same.

A NAND-type non-volatile semiconductor memory that can electrically rewrite data changes an amount of charge in a charge storage layer of a cell gate transistor to change a threshold voltage and records the data. Generally, electrons are discharged/injected between the charge storage layer and a semiconductor substrate via a gate insulating film to control the amount of the charge in the charge storage layer.

In a NAND-type non-volatile semiconductor memory according to a first conventional technology, along a bit line direction, a plurality of cell gates including a charge storage layer provided on a main surface of a semiconductor substrate via a gate insulating film and a control gate electrode provided on the charge storage layer via a charge block layer are aligned at a space from each other. On the main surface of the semiconductor substrate between the adjacent cell gates, a source or drain diffusion layer is provided, by which a plurality of memory cell transistors are connected in series. Further, between the adjacent cell gates, an insulating film between the cells is provided (refer to, for example, Japanese Patent Laid-Open No. 2006-310393).

For such a NAND-type non-volatile semiconductor memory, in accordance with miniaturization of a memory dimension, it is necessary to decrease impurity concentration in a source or drain diffusion layer to avoid a short channel effect (decreasing a threshold voltage of the memory cell transistor). Typically, when the memory dimension is about 50 nm, the impurity concentration in the diffusion layer is about $1\times10^{18}$ to $1\times10^{20}$ cm$^{-3}$.

The NAND-type non-volatile semiconductor memory according to a second conventional technology, a plurality of cell gate including a charge storage layer provided via a gate insulating film on the main surface of a semiconductor layer included in a Silicon On Insulator (SOI) provided on a surface of a base via an insulating layer and a control gate electrode provided on the charge storage layer via a charge block layer are aligned at a space from each other. Between each of the cell gates, an insulating film between the cells is provided. A plurality of memory cell transistors in the NAND-type non-volatile semiconductor memory are connected by the semiconductor layer in series to perform a transistor operation of a depression type (refer to, for example, Japanese Patent Laid-Open No. 2006-294711).

For such a NAND-type non-volatile semiconductor memory, it is also necessary to decrease impurity concentration in a semiconductor layer to ensure a cut-off operation of the memory cell transistor in order to minute the memory dimension.

In both of the NAND-type non-volatile semiconductor memories described above, the impurity concentration in the diffusion layer or the semiconductor layer is set to low in order to minute the memory dimension. Therefore, when the cell transistor is turned on, resistance in the diffusion layer or the semiconductor layer caused by the decreased impurity concentration is increased to decrease a cell current, thereby causing a memory operation error.

SUMMARY OF THE INVENTION

According to one aspect of the present invention, there is provided a semiconductor memory device comprising:

a substrate having a semiconductor layer;

an n-type semiconductor region formed beneath a main surface of the semiconductor layer;

a plurality of cell gates being aligned at a space from each other and including a gate insulating film formed on the main surface of the semiconductor layer, a charge storage layer formed on the gate insulating film, a charge block layer formed on the charge storage layer and a control gate electrode formed on the charge block layer;

an insulating film between cells formed on the main surface of the semiconductor layer between the cell gates; and a carbon accumulation region formed in the insulating film between the cells and has a maximum concentration of a carbon element in a region within 2 nm from an interface between the semiconductor layer and the insulating film between the cells.

According to one aspect of the present invention, there is provided a method for fabricating a semiconductor memory device comprising:

sequentially forming a first insulating film, a charge storage material layer, a charge block material layer, a control gate electrode material layer and a mask member on a main surface of a substrate including a semiconductor layer;

forming a plurality of cell gates by removing the mask member, the control gate electrode material layer, the charge block material layer, and the charge storage material layer along a predetermined direction at a predetermined space;

introducing a carbon element into the first insulating film using the cell gate including the mask member as a mask; and forming a second insulating film in such a manner burying between the cell gates.

According to one aspect of the present invention, there is provided a method for fabricating a semiconductor memory device comprising:

sequentially forming a first insulating film, a charge storage material layer, a charge block material layer, a control gate electrode material layer and a mask member on a main surface of a substrate including a semiconductor layer;

forming a plurality of cell gates by removing the mask member, the control gate electrode material layer, the charge block material layer, the charge storage material layer, and the first insulating film along a predetermined direction at a predetermined space;

forming a second insulating film between the cell gates; and introducing a carbon element into the second insulating film by immersing the second insulating film into organic solvent and annealing.

DESCRIPTION OF THE EMBODIMENTS

Referring to Figs, embodiments of the present invention will be described.

First Embodiment

Figure 1:
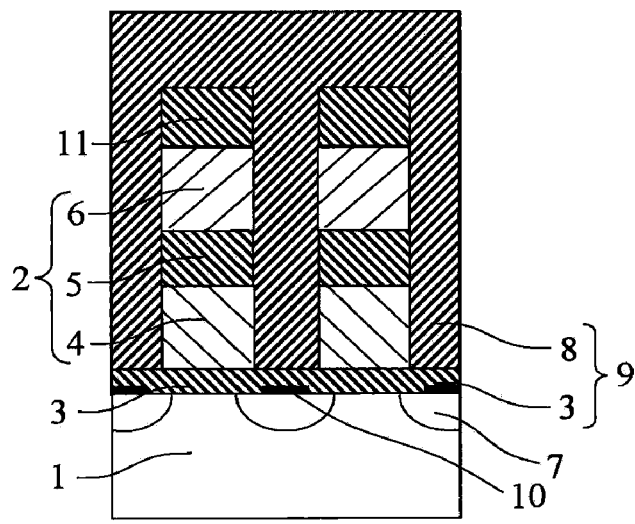
FIG. 1 is a sectional view of a structure of a semiconductor memory device according to a first embodiment of the present invention.

FIG. 1 is a cross-sectional view of a NAND-type non-volatile semiconductor memory according to a first embodiment of the present invention. The diagram illustrates only two of a plurality of memory cell transistors adjacent to each other in a bit line direction (channel length direction).

As illustrated in FIG. 1, in a memory cell transistor of the NAND-type non-volatile semiconductor memory of the present embodiment, on a main surface of a p-type silicon substrate 1 (semiconductor layer), a plurality of cell gates 2 are aligned at a space from each other along the bit line direction. Each cell gate 2 has a stack structure that includes a charge storage layer 4 provided on the p-type silicon substrate 1 via a gate insulating film 3 and a control gate electrode 6 provided on the charge storage layer 4 via a charge block layer 5. Here, a mask member 11 is provided on the control gate electrode 6.

The gate insulating film 3 includes, for example, a silicon oxide film, the charge accumulation layer 4 includes, for example, a conductive member such as a doped polysilicon or an insulating film having charge trap sites such as a silicon nitride film. The charge block layer 5 includes, for example, a silicon oxide film, a silicon oxynitride film, or an insulating film of a high dielectric material having permittivity higher than that of a silicon oxide film, for example, a hafnium aluminate. The control gate electrode 6 includes a double-layer structure including, for example, a doped polysilicon or a doped polysilicon/silicide.

Between the adjacent cell gates 2 on the main surface of the p-type silicon substrate 1, an n-type diffusion layer 7 is provided as a source layer/drain layer, by which a plurality of memory cell transistor are connected in series.

Further, an insulating film 9 between the cells is provided between cell gates 2 and on the cell gate 2. Here, the insulating film 9 between the cells includes the gate insulating film 3 extended over a surface of the n-type diffusion layer 7 between the cell gates 2 and a buried insulating film 8 between the cell gates 2 and on the cell gate 2. The buried insulating film 8 includes, for example, a silicon oxide film and is formed by a Chemical Vapor Deposition (CVD) method.

Near an interface between the p-type silicon substrate 1 and a part of the insulating film 9 between the cell gates 2, a carbon accumulation region 10 including the carbon element having a high concentration is provided. The carbon accumulation region 10 is formed by the injected/diffused carbon element.

In the carbon accumulation region 10, the carbon element near the interface on the p-type silicon substrate 1 has the positive fixed charge. According to an experimental result using an X-ray Photoelectron Spectroscopy (XPS) analysis, it is considered that a positive fixed charge is caused by a C-Si combination in which a carbon element and a silicon element are combined to each other when a silicon substrate is used as a substrate.

Figure 2:
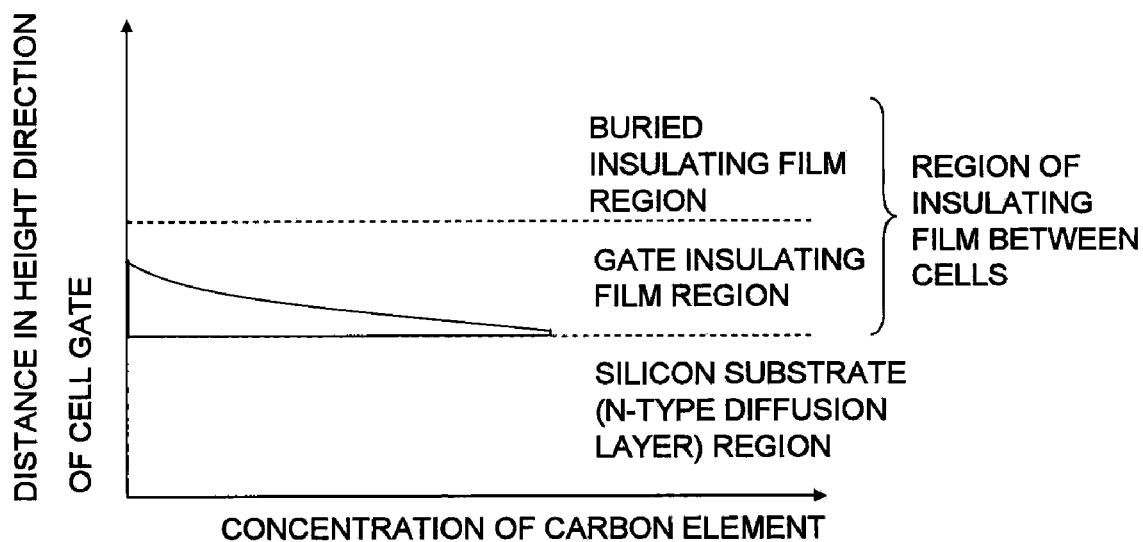
FIG. 2 is a space distribution diagram of a carbon element in the semiconductor memory device in a cell height direction according to the first embodiment of the present invention.

FIG. 2 illustrates a space distribution of the concentration of the carbon element in a height direction of the cell gate 2 (in a vertical direction with respect to the main surface of the p-type silicon substrate 1) in the carbon accumulation region 10. According to the present embodiment, a concentration of the space distribution of the carbon element in the carbon accumulation region 10 is the maximum on the interface of the n-type diffusion layer 7 and gradually decreasing along the height direction of the cell gate 2. That is, the carbon element is eccentrically located on the interface of the n-type diffusion layer 7 in the height direction of the cell gate 2.

As described above, since the carbon element in the insulating film 9 between the cells is combined to the silicon element to become a positive fixed charge, a concentration of carriers (electrons) is increased in the n-type diffusion layer 7 formed directly beneath the carbon accumulation region 10, and the cell current to be flown when the plurality of memory cell transistor connected in series are all on-state is increased. Therefore, the nearer to the interface of the n-type diffusion layer 7 the carbon element having a high concentration exists in the height direction of the cell gate 2, the more effects of increasing the concentration of the carriers (electros) can be obtained, which is preferable.

Further, according to the present embodiment, the highest part of the concentration of the carbon element is located in a region within 2 nm (so-called, a network structure transition region) from the main surface of the p-type silicon substrate 1 (n-type diffusion layer 7) in the height direction of the cell gate 2. This is because, if a great amount of the carbon element exists in an upper layer region (so-called bulk region) of the gate insulating film 3 located about 2 nm or more away, a variation of the threshold voltage of the memory cell transistor becomes larger when a memory cell writing/erasing is operated. It is considered that, if a great amount of the carbon element exists in the bulk region and a network structure of the gate insulating film 3 is warped, a charge trap is easily generated by injecting carrier when the memory cell writing/erasing is operated. Thus, in view of high reliability, in the height direction of the cell gate 2, it is preferred that the carbon element is eccentrically located in the region of the gate insulating film 3 within 2 nm from the interface on the n-type diffusion layer 7.

Further, according to the present embodiment, an area density of the carbon element in the carbon accumulation region 10 is set to about $1\times10^{12}$ to $1\times10^{15}$ cm$^{-2}$ in a peak concentration region.

Owing to the positive charge by the carbon element in the carbon accumulation region 10, the concentration of the carriers (electrons) is increased in the n-type diffusion layer 7, and the cell current to be flown when the memory cell transistors are all on-state is increased according to the concentration of the carbon element. It was experimentally confirmed that the effect of the increased cell current begins to appear when the area density of the carbons is $1\times10^{12}$ cm$^{-2}$ or higher in a case where the cell dimension (i.e., channel length and space between cells) is about 30 to 100 nm. The cell current generally increases to 1.1 times more than a conventional device when the area density of the carbon element is $1\times10^{13}$ cm$^{-2}$, and generally two times more than the conventional device when the area density of the carbon element is $1\times10^{15}$ cm$^{-2}$ However, when the area density of the carbons exceeds $1\times10^{15}$ cm$^{-2}$, insulation quality of the insulating film 9 between the cells starts to be deteriorated to increase a leakage current between the adjacent cell gates 2, and thus the memory operation error can be hardly avoided, which is not preferable. Therefore, as described above, the area density of the carbon element in the carbon accumulation region 10 is set in a region of about $1\times10^{12}$ cm$^{-2}$ to $1\times10^{15}$ cm$^{-2}$ in the peak concentration region.

Further, in the present embodiment, it is preferred that the dopant concentration in the n-type diffusion layer 7 is $1\times10^{20}$ cm$^{-3}$ or lower. This is because, when the dopant concentration in the n-type diffusion layer 7 is as low as $1\times10^{20}$ cm$^{-3}$ or lower, the effects of increasing the concentration of the carriers in the n-type diffusion layer 7 is large owing to the existing carbon element, however, when the dopant concentration is $1\times10^{20}$ cm$^{-3}$ or higher, the effects of increasing the concentration of the carriers is not very large, thus, when a great number of the carbon element unnecessarily exist on a direct upper region of the diffusion layer, a mobility of the carriers flowing in the channel is decreased by Coulomb scattering caused by the positive charge, and the cell current can be adversely decreased.

Figure 3:
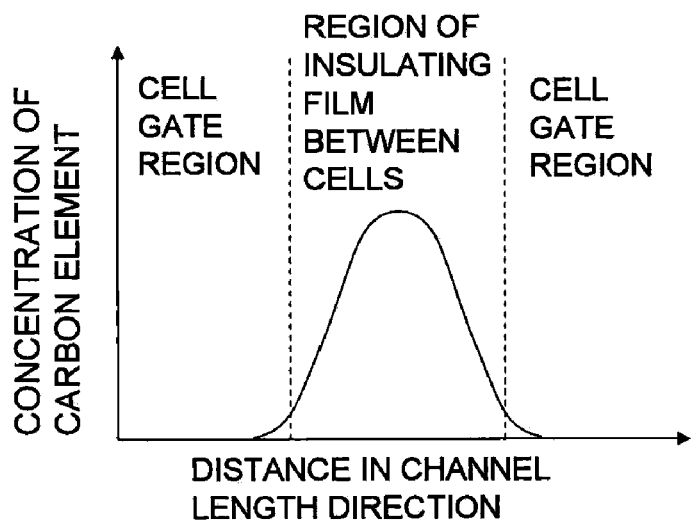
FIG. 3 is a space distribution diagram of the carbon element in the semiconductor memory device in a channel length direction according to the first embodiment of the present invention.

FIG. 3 illustrates the space distribution of the concentration of the carbon element in the carbon accumulation region 10 in the channel length direction (a horizontal direction (parallel) to the main surface of the p-type silicon substrate 1). According to the present embodiment, the concentration of the space distribution of the carbon element is the maximum at a center portion between the cell gates 2 and gradually decreasing toward the cell gate 2. The carriers passing through the gate insulating film 3 in an up and down direction when the memory cell writing/erasing is operated collide into configuration components of the gate insulating film 3 and are scattered into a width in a lateral direction having a generally similar thickness of the gate insulating film. Therefore, a number of carriers pass through peripheral regions of a part of the insulating film 9 between the cells at both sides thereof (typically, a region about a thickness of the gate insulating film 3 inside from a boundary of the cell gate 2). Accordingly, if the concentration of the carbon element is high in the peripheral region, the charge trap is generated to cause the variation of the threshold voltage of the cell transistor. An amount of variation is increased according to an increased number of writing/erasing.

To address the problem, according to the present embodiment, the concentration of the carbon element at the center portion of the insulating film 9 between the cells is set higher than that in the peripheral region (near the interface between the cell gates 2 and the insulating film 9 between the cells) at both sides of the center portion to ensure a sufficient number of writing/erasing operations.

For practical use, if the concentration of the carbon element in the peripheral region of the part of the insulating film 9 between the cells is set to $\frac{1}{10}$ or lower of the maximum concentration of the carbon at the center portion, the variation of the threshold voltage can be effectively reduced. Further, if the concentration of the carbon element in the peripheral region of the part of the insulating film 9 between the cells is set to $\frac{1}{100}$ or lower of the maximum concentration of the carbon at the center portion, the variation of the threshold can be sufficiently reduced.

FIGS. 4 to 7 are process cross-sectional views each schematically illustrating a method for fabricating the NAND-type non-volatile semiconductor memory according to the first embodiment of the present invention. Referring to FIGS. 4 to 7, a method for fabricating the NAND-type non-volatile semiconductor memory according to the first embodiment of the present invention will be described.

Figure 4:
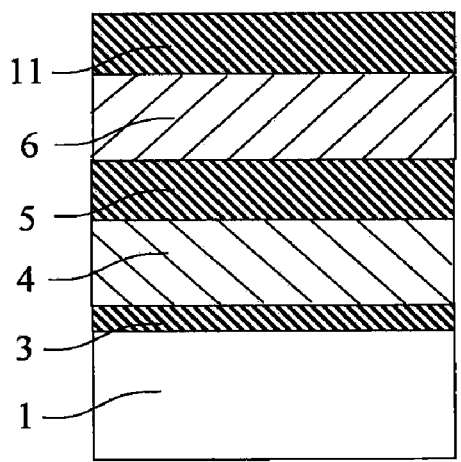
FIG. 4 is a sectional view schematically illustrating a part of a method for fabricating the semiconductor memory device according to the first embodiment of the present invention.

First, as illustrated in FIG. 4, on the main surface of the silicon substrate 1 on which the p-type impurity is doped, for example, a first silicon oxide film 3 that is the gate insulating film is formed having a thickness 6 nm by a known thermal oxide method. Subsequently, by the CVD method, for example, a phosphorous-doped polycrystal silicon film 4 that is a charge storage material layer is deposited having a thickness 50 nm on the first silicon oxide film 3. Subsequently, by an Atomic Layer Deposition (ALD) method, for example, a hafnium aluminate film 5 that is the charge block material film is deposited having a thickness 25 nm on the doped polycrystal silicon layer 4. Further, by the known CVD method, a conductive layer 6 having a double structure including a doped polycrystal silicon layer/tungsten silicide layer that is the control gate electrode material layer is deposited on the hafnium aluminate film 5. Furthermore, a silicon nitride film 11 that is the mask member for Reactive Ion Etching (RIE) is deposited on the conductive layer 6.

Figure 5:
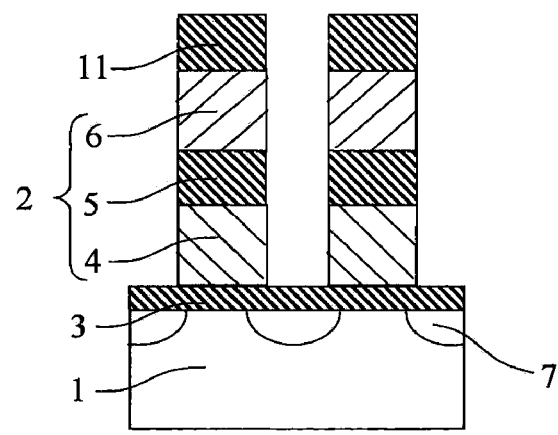
FIG. 5 is a sectional view showing a step subsequent to FIG. 4.

Subsequently, as illustrated in FIG. 5, by the known RIE method using a resist mask (not illustrated), the silicon nitride film 11, conductive layer 6, hafnium aluminate film 5, and doped polycrystal silicon layer 4 are sequentially etching processed to form a plurality of the cell gates 2 including the charge storage layer 4, charge block layer 5, control gate electrode 6, and mask member 11 deposited on the gate insulating film 3. At this point, a width of the charge storage layer 4 and a space between the charge storage layers 4 are both formed to be 50 nm. Subsequently, using the cell gate 2 including the mask member 11 as a mask, an n-conductive type impurity, for example, arsenic (As) is injected into the main surface of the silicon substrate 1 between the adjacent cell gates 2 by the known ion implantation method, and is thermal annealed to form an n-type diffusion layer 7.

Figure 6:
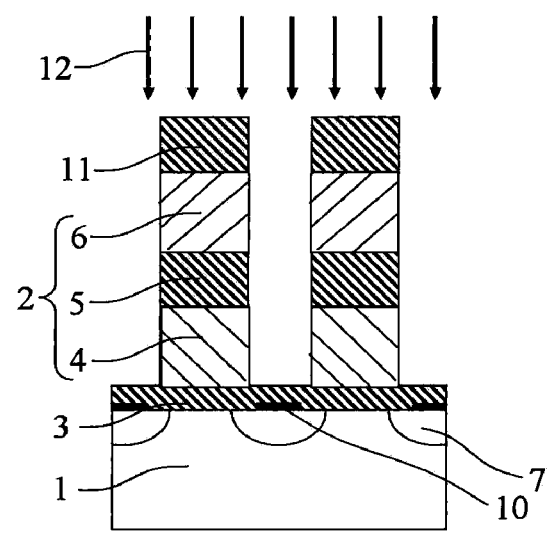
FIG. 6 is a sectional view showing a step subsequent to FIG. 5.

As illustrated in FIG. 6, using the cell gate 2 including the mask member 11 as a mask, carbon ions are introduced into the gate insulating film 3 between the cell gates 2 by ion implantation 12. Acceleration energy for injecting ions is set to about 1 keV such that a range of the carbon ion is smaller than a thickness of the gate insulating film. At this point, since the acceleration energy is set to as low as about 1 keV, in a momentum distribution of injected ions, the momentum in a direction perpendicular to an injecting direction becomes obvious. Accordingly, in a distribution of an amount of the ion dose reaching the gate insulating film 3 after passing between the cell gates 2 that has a high aspect ratio, the concentration of the ions can be the maximum at a center portion between the cell gates 2 and gradually decreasing toward the cell gate 2, as illustrated in FIG. 3. Further, the amount of the carbon ions dose is set to about $2 \times 10^{12}$ to $2 \times 10^{15}$ cm$^{-2}$. Subsequently, the introduced carbon element is thermal diffused by annealing. At this point, of the carbon element introduced into the gate insulating film, generally half thereof is diffused downwardly and eccentrically located in an interface region on the silicon substrate (n-type diffusion layer 7) to generate the positive fixed charge. Generally, the rest half thereof is diffused upwardly to be removed to an outside. Further, since the carbon element also includes components to be diffused in the lateral direction, the carbon accumulation region 10 including the space distribution of the carbon element is formed as illustrated in FIGS. 2 and 3. According to the present embodiment, if the acceleration energy is set such that most of the injected carbon ions stops in the gate insulating film 3, a level of the carrier mobility can be inhibited from being decreased, since a number of the introduced carbon element into the n-type diffusion layer 7 can be decreased.

Figure 7:
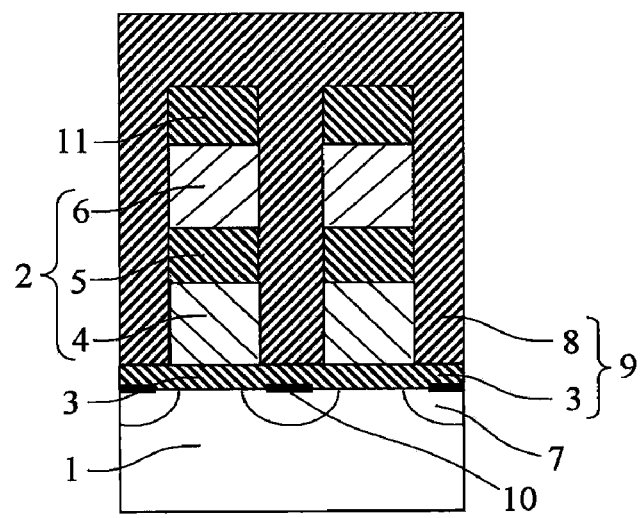
FIG. 7 is a sectional view showing a step subsequent to FIG. 6.

As illustrated in FIG. 7, using a plasma CVD method or a spin-coating method, the buried insulating film 8 including the silicon oxide film is formed to form the insulating film 9 between the cells including the buried insulating film 8 and the gate insulating film 3 extended between the cell gates 2. Subsequently, using the known technology, a wiring layer (not illustrated) is formed to obtain the NAND-type non-volatile semiconductor memory.

According to the present embodiment, the carbon accumulation region 10 having the positive fixed charge in the part of the insulating film 9 between the cells on the n-type diffusion layer 7 between the cell gates 2 such that the concentration of the carbon element in the carbon accumulation region 10 is the maximum on the interface between the insulating film 9 between the cells and the n-type diffusion layer 7. Accordingly, the concentration of the carriers (electrons) in the n-type diffusion layer 7 is increased to increase the cell current when the memory cell transistors are all on-state.

Further, the maximum part of the concentration of the carbon element in the carbon accumulation region 10 exists in the region of the insulating film 9 between the cells that is located within 2 nm from the n-type diffusion layer 7, that is, the main face of the silicon substrate 1 in the height direction of the cell gate 2. Therefore, the variation of the threshold voltage of the transistor caused by the memory writing/erasing operation can be decreased. The area density of the carbon element in the carbon accumulation region 10 is set to about $1 \times 10^{12}$ to $1 \times 10^{15}$ cm$^{-2}$ in the peak concentration region. Thus, the leakage current between the cell gates caused by the deteriorated insulating quality of the insulating film between the cells can be inhibited and effectively prevented the memory operation error.

In the channel length direction, the device is formed such that the concentration of the carbon element at the center portion of the insulating film 9 between the cells is higher than that at the peripheral regions at both sides of the center portion. Further, the carbon element hardly exists in a region beneath the cell gate 2. Therefore, the variation of the threshold voltage of the transistor caused by the charge trap during the memory writing/erasing operation can be decreased.

According to the present embodiment, instead of the ion implantation, the similar effects can be obtained by exposing the silicon substrate to the carbon plasma and introducing the carbon element into the gate insulating film 3. At this point, further, applying the lead-in bias into the silicon substrate can improve the introducing effects of the carbon element, which is preferable. Since this plasma exposing method decreases the range of the introducing carbon element compared to the ion implantation method, introducing the carbon element into the n-type diffusion layer 7 can be more easily inhibited than by the ion implantation method, which is preferable.

According to the present embodiment, instead of the carbon accumulation region including the carbon element, the nitrogen accumulation region including the nitrogen element having a level of the concentration similar to that of the carbon element can be provided to obtain the effects of increasing the carrier concentration. When the nitrogen element is introduced by the ion implantation method, since nitrogen element has a shorter implantation range than that of the carbon ions, slightly higher acceleration energy than that for the carbon ions is preferably set. However, since the nitrogen element can easily generate the charge trap level compared to the carbon element, when applied for the highly reliable memory, the carbon element may be preferably used.

Second Embodiment

Figure 8:
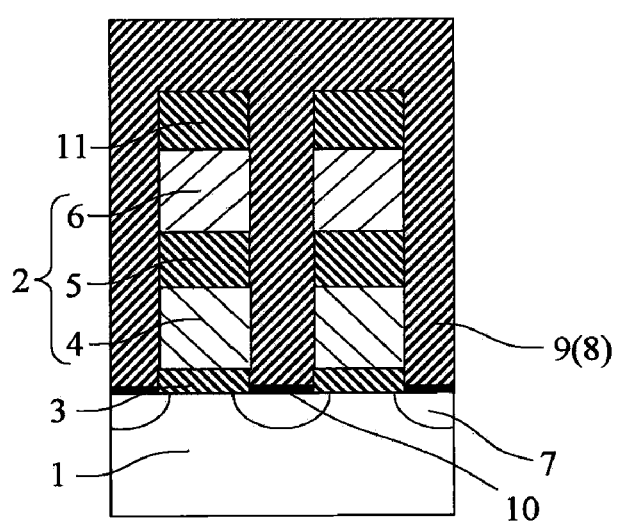
FIG. 8 is a sectional view of a structure of a semiconductor memory device according to a second embodiment of the present invention.

Next, a second embodiment of the present invention will be described. FIG. 8 is a cross-sectional view of a NAND-type non-volatile semiconductor memory according to the second embodiment of the present invention. The present embodiment includes a structure of the NAND-type non-volatile semiconductor memory of the first embodiment, where a part of the gate insulating film 3 extended between the cell gates 2 is removed from the NAND-type non-volatile semiconductor memory of the first embodiment. Since the materials and structures of the films other than the characteristics described above are similar to those of the first embodiment, the descriptions of the similar parts will be omitted here.

Figure 9:
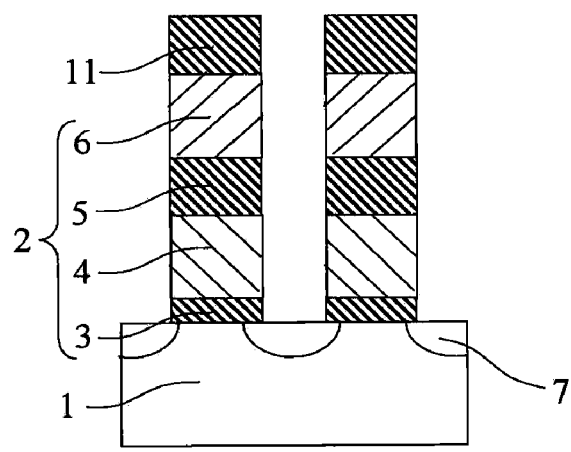
FIG. 9 is a sectional view schematically illustrating a part of a method for fabricating the semiconductor memory device according to the second embodiment of the present invention.
Figure 10:
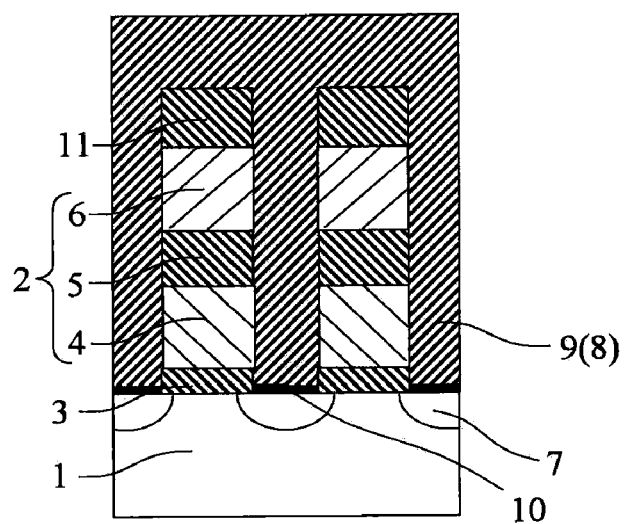
FIG. 10 is a sectional view showing a step subsequent to FIG. 9.

Referring to FIGS. 9 and 10, a method for fabricating the NAND-type non-volatile semiconductor memory according to the second embodiment of the present invention will be described. Since the fabrication method of the second embodiment is similar to the fabrication process in FIG. 4 of the first embodiment, the detailed descriptions of the fabrication process will be omitted here. Following the fabrication process of FIG. 4, by the RIE method as illustrated in FIG. 9, the first silicon nitride film 11, conductive layer 6, hafnium aluminate film 5, doped polycrystal silicon layer 4, and gate insulating film 3 are sequentially etching processed to form the plurality of cell gates 2 including the gate insulating film 3, charge storage layer 4, charge block layer 5, control gate electrode 6, and mask member 11 deposited on the silicon substrate 1.

Following to formation of the n-type diffusion layer 7, as illustrated in FIG. 10, using the known plasma CVD method or spin-coating method, the buried insulating film 8, for example, the silicon oxide film is deposited between the cell gates 2 and on the cell gate 2 to form the insulating film 9 between the cells. Subsequently, the silicon substrate 1 is entirely kept in the organic solvent until the carbon element in the insulating film 9 between the cells is increased to about 0.1 to 10 atom %. Here, the organic solvent may be, for example, alcohols such as isopropyl alcohol or ethers. The buried insulating film that becomes the insulating film between the cells may be preferably used, since the insulating film having a low density including a large amount of hydroxyl group or carbohydrate group easily introduces the organic solvent.

Figure 11:
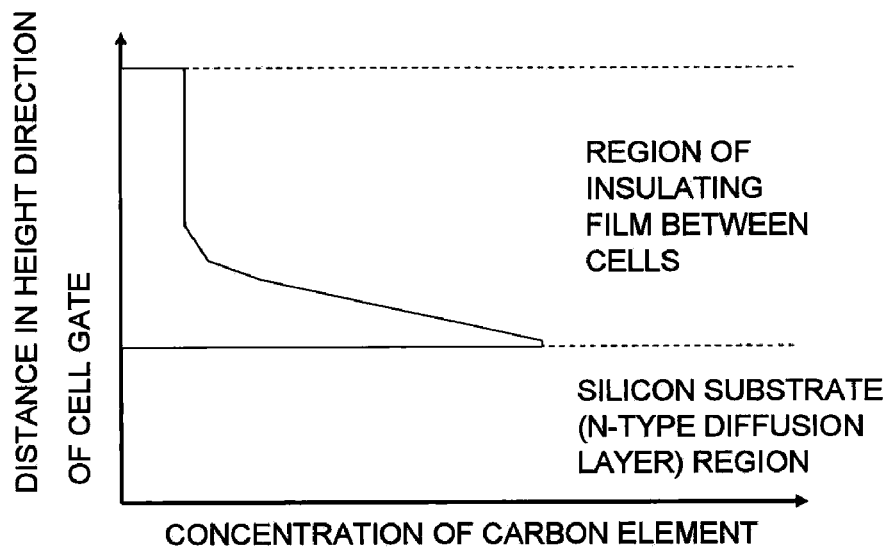
FIG. 11 is a space distribution diagram of a carbon element in the semiconductor memory device in a cell height direction according to the second embodiment of the present invention.
Figure 12:
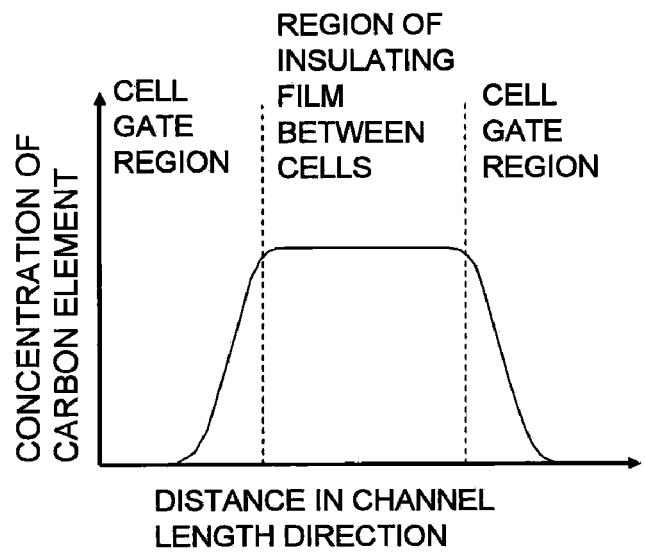
FIG. 12 is a space distribution diagram of the carbon element in the semiconductor memory device in a channel length direction according to the second embodiment of the present invention.

The insulating film between the cells is annealed at 400 to 800° C. for several minutes to thermal diffuse (solid phase diffuse) the carbon element. At this point, the carbon element diffused in a direction of the interface between the silicon substrate 1 and the insulating film 9 between the cells has diffusion coefficients that are different in the insulating film 9 between the cells from in the silicon substrate 1, the carbon element is eccentrically located on the interface between the insulating film 9 between the cells and diffusion layer 7 by adjusting the annealing temperature, and a part of the carbon element is combined to the silicon element included in the silicon substrate to become the positive fixed charge. The carbon element diffused in an opposite direction to the interface direction is removed outside the insulating film 9 between the cells. As a result, the carbon accumulation region 10 having the space distribution in the cell height direction as illustrated in FIG. 11 and the space distribution in the channel length direction as illustrated in FIG. 12 can be obtained. Here, by adjusting the annealing time, the area density of the carbon element in the carbon accumulation region 10 is set to about $1 \times 10^{12}$ to $1 \times 10^{15}$ cm$^{-2}$ in the peak concentration region. Using the known technology, the wiring layer (not illustrated) is formed to obtain the NAND-type non-volatile semiconductor memory.

According to the second embodiment, the similar effects to that of the first embodiment can be also obtained. In a case of the fabrication method, as illustrated in FIG. 12, a considerably high level of concentration of the carbon element can exist in the cell gate region. Accordingly, since the NAND-type non-volatile semiconductor memory has a structure in which the variation of the threshold voltage of the memory cell transistor caused by generating the charge trap easily occurs, the memory cell writing/erasing operation is preferably restricted for the use.

Further, for the fabrication method, if the charge storage layer 4 and the control gate electrode 6 formed of the silicon material are used, when the carbon element contained in the insulating film 9 between the cells is thermal diffused, the carbon element can be eccentrically located on the sides of the charge storage layer 4 and the control gate electrode 6 to form the positive fixed charge. Particularly, the fixed charge on the charge storage layer 4 can cause the variation of the threshold voltage of the memory cell transistor. In order to address the problem, the amount of variation needs to be considered for device operation designing.

In the present embodiment, instead of the carbon accumulation region including the carbon element, the nitrogen accumulation region including the nitrogen element having the level of the concentration similar to that of the carbon element can be provided to obtain the effects of increasing the carrier concentration. The nitrogen element is eccentrically located near the interface on the silicon substrate by thermal diffusing by annealing, for example, after being immersed into the ammonia solvent. However, since the nitrogen element can easily generate the charge trap level compared to the carbon element, when applied for the highly reliable memory, the carbon element may be preferably used.

Third Embodiment

Figure 13:
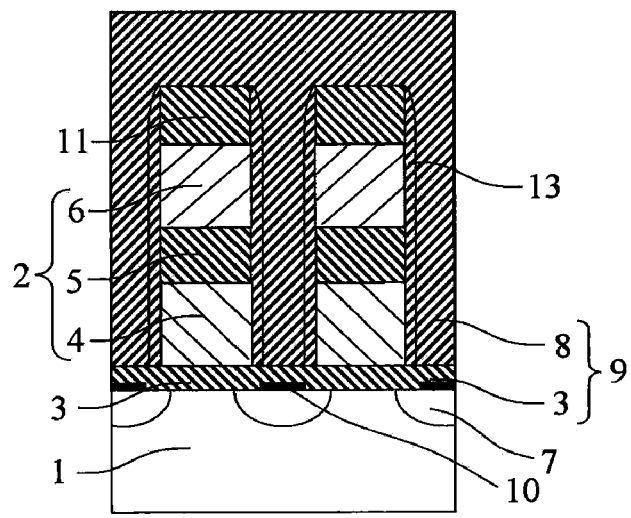
FIG. 13 is a sectional view of a structure of a semiconductor memory device according to a third embodiment of the present invention.

The NAND-type non-volatile semiconductor memory according to a third embodiment of the present invention will be described. FIG. 13 is a cross-sectional view of the NAND-type non-volatile semiconductor memory according to the third embodiment of the present invention. In the figure, only adjacent two of a plurality of memory cell transistors in the bit line direction (channel length direction) are illustrated. According to the present embodiment, in addition to the NAND-type non-volatile semiconductor memory described in the first embodiment, an insulating film 13 on a gate side wall including the silicon nitride film or silicon oxide film is further provided on the side surfaces of the cell gate and the mask member. Since the materials and structures of the films other than the characteristics described above are similar to those of the first embodiment, the descriptions of the similar parts will be omitted here.

In the fabrication method of the first embodiment as described above, the NAND-type non-volatile semiconductor memory according to the present embodiment can be fabricated by applying a process for forming the insulating film 13 on the gate side wall having a thickness about several nm on side walls of the cell gate 2 using the known CVD method and RIE method after the cell gate 2 is formed by etching using the RIE method.

Figure 14:
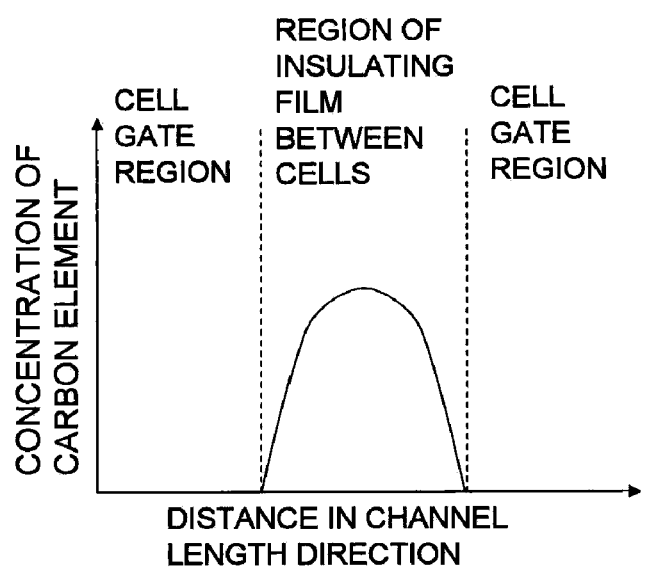
FIG. 14 is a space distribution diagram of the carbon element in the semiconductor memory device in a channel length direction according to the third embodiment of the present invention.

As illustrated in FIG. 13, if the insulating film 13 on the gate side wall including the silicon nitride film or silicon oxide film is formed, the insulating film 13 on the gate side wall can be used as a spacer when the carbon ions are introduced. Thus, a distance from the cell gate 2 can be provided in the channel length direction (the horizontal direction to the main surface of the p-type silicon substrate 1) and the space distribution of the carbon element as illustrated in FIG. 14 can be obtained. FIG. 2 illustrates the space distribution of the concentration of the carbon element in the carbon accumulation region 10 in the height direction of the cell gate 2 (a vertical direction to the main surface of the silicon substrate 1).

According to the present embodiment, the carbon accumulation region 10 is provided such that the carbon element hardly exists in the region beneath the cell gate 2. This is because, if the carbon element exists in the region beneath the cell gate 2, the charge trap is generated when the memory cell writing/erasing is operated and thereby the variation of the threshold voltage of the memory cell transistor is increased. Further, if the carbon element exists in the region beneath the cell gate 2, minority carrier is induced in the channel even when the memory cell transistor is off-state, resulting in deteriorating the cut-off characteristics. That is, the short channel effect becomes significant. Therefore, in the present embodiment, the carbon accumulation region 10 is selectively provided in the part of the insulating film 9 between the cells between the cell gates 2.

According to the present embodiment as described above, as illustrated in FIG. 14, the region beneath the cell gate 2 can be provided such that the carbon element hardly exists, and the variation of the threshold voltage of the memory cell transistor and the short channel effect (or cut-off characteristics deterioration) can be effectively inhibited.

According to the present embodiment, instead of the carbon accumulation region including the carbon element, the nitrogen accumulation region including the nitrogen element having the level of the concentration similar to that of the carbon element can be provided to obtain the effect of increasing the carrier concentration. However, since the nitrogen element can easily generate the charge trap level compared to the carbon element, when applied for the highly reliable memory, the carbon element may be preferably used.

Fourth Embodiment

Figure 15:
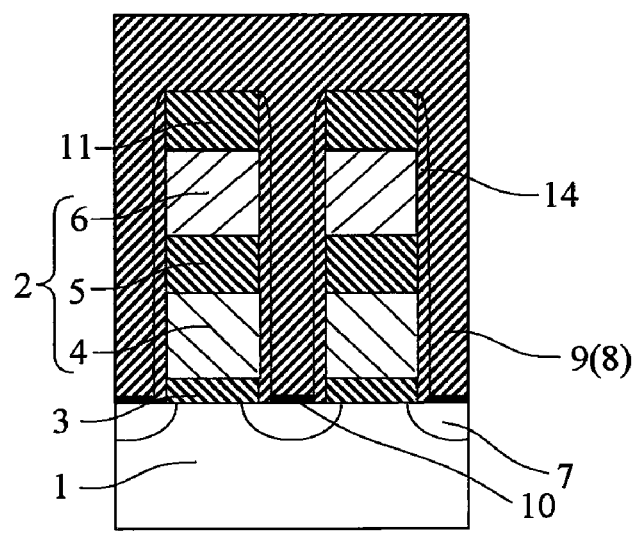
FIG. 15 is a sectional view of a structure of a semiconductor memory device according to a fourth embodiment of the present invention.

Next, the NAND-type non-volatile semiconductor memory according to a fourth embodiment of the present invention will be described. FIG. 15 is a cross-sectional view of the NAND-type non-volatile semiconductor memory according to the fourth embodiment of the present invention. In addition to the NAND-type non-volatile semiconductor memory described in the second embodiment, an insulating film 14 on a gate side wall including the silicon nitride film is further provided on the side surfaces of the cell gate and mask member. Since the materials and structures of the films other than the characteristics described above are similar to those of the second embodiment, the descriptions of the similar parts will be omitted here.

In the fabrication method of the second embodiment as described above, the NAND-type non-volatile semiconductor memory according to the present embodiment can be fabricated by applying a process for forming the insulating film 14 on the gate side wall having a thickness about several nm on side walls of the cell gate 2 using the known CVD method and RIE method after the cell gate 2 is formed by etching using the RIE method.

As illustrated in FIG. 15, if the insulating film 14 on the gate side wall including the silicon nitride film is formed, when the carbon element is diffused, the diffusion of the carbon element in the channel length direction can be blocked by the insulating film 14 on the gate side wall. Further, a distance from the cell gate 2 can be provided by the insulating film 14 on the gate side wall and the carbon element can be inhibited from being diffused in the region beneath the cell gate 2, resulting in the space distribution of the carbon element as illustrated in FIG. 14 can be obtained.

In the present embodiment, similarly to the third embodiment, the carbon accumulation region 10 is also provided such that the carbon element hardly exists in the region beneath the cell gate 2. Thus, the variation of the threshold voltage of the memory cell transistor and the short channel effect (or cut-off characteristics deterioration) can be effectively inhibited.

In the present embodiment, instead of the carbon accumulation region including the carbon element, the nitrogen accumulation region including the nitrogen element having a level of the concentration similar to that of the carbon element can be provided to obtain effects of increasing the carrier concentration. However, since the nitrogen element can easily generate the charge trap level compared to the carbon element, when applied for the highly reliable memory, the carbon element may be preferably used.

Modification of Fourth Embodiment

Figure 16:
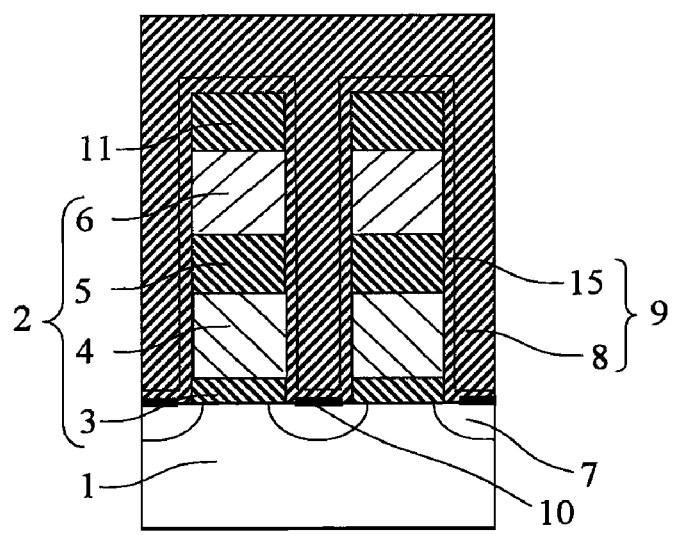
FIG. 16 is a sectional view of a structure of a semiconductor memory device according to a modification of the fourth embodiment of the present invention.

A modification of a forth embodiment of the present invention will be described. FIG. 16 is a cross-sectional view of the NAND-type non-volatile semiconductor memory according to the modification of the fourth embodiment of the present invention. According to the present embodiment, in addition to the NAND-type non-volatile semiconductor memory described in the second embodiment (FIG. 10), a liner insulating film 15 including the insulating film having a low density such as the silicon oxide film is further provided on side surfaces of the cell gate and on side surfaces and upper surface of the mask member. Since the materials and structures of the films other than the characteristics described above are similar to those of the second embodiment, the descriptions of the similar parts will be omitted here.

In the second embodiment as described above, the NAND-type non-volatile semiconductor memory according to the present embodiment can be fabricated by forming the liner insulating film 15 having a low density and a thickness about several nm on the side walls of the cell gate 2 and side surfaces and upper face of the mask member 11 using the known plasma CVD method or spin-coating method, after the cell gate 2 is formed by etching to the gate insulating film 3 using the RIE method. Further, the NAND-type non-volatile semiconductor memory is kept in the organic solvent until the carbon element is contained by the liner insulating film 15 and thermal diffused to form the carbon accumulation region 10. Subsequently, the buried insulating film 8 is formed in order to form the insulating film 9 between the cells including the liner insulating film 15 and the buried insulating film 8 so that the NAND-type non-volatile semiconductor memory is fabricated.

In the modification of the fourth embodiment as described above, the similar effects to that of the second embodiment can be obtained. Further, the distance of thermal diffusion of the carbon element is short, controllability for the distribution of the concentration of the carbon element can be improved to lower temperature during the fabrication process.

In the present embodiment, instead of the carbon accumulation region including the carbon element, the nitrogen accumulation region including the nitrogen element having a level of the concentration similar to that of the carbon element can be provided to obtain the effects of increasing the carrier concentration. The nitrogen element can be eccentrically located near the interface of the silicon substrate by thermal diffusing by annealing, for example, after being immersed into the ammonia solvent. However, since the nitrogen element can easily generate the charge trap level compared to the carbon element, when applied for the highly reliable memory, the carbon element may be preferably used.

Fifth Embodiment

Figure 17:
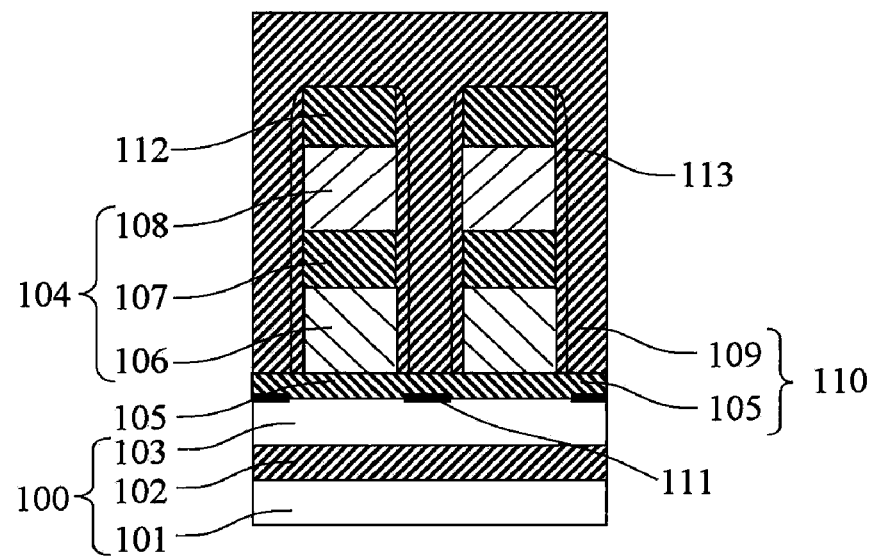
FIG. 17 is a sectional view of a structure of a semiconductor memory device according to a fifth embodiment of the present invention.

FIG. 17 is a cross-sectional view of the NAND-type non-volatile semiconductor memory according to the fifth embodiment of the present invention. The fifth embodiment is configured to use an SOI substrate instead of the silicon substrate of the third embodiment.

As illustrated in FIG. 17, the SOI substrate 100 includes an n-type silicon layer (semiconductor layer) 103 provided on a base 101 via an insulating layer 102. On a main surface of the n-type silicon layer 103, a plurality of cell gates 104 are aligned at a space from each other along the bit line direction.

Each cell gate 104 has a deposition structure that includes a charge storage layer 106 provided on a main surface of the n-type silicon layer 103 via a gate insulating film 105, a control gate electrode 108 provided on the charge storage layer 106 via a charge block layer 107. A mask member 112 is provided on the cell control gate 108. Here, on the sides of the cell gate 104 and the mask member 112, a gate side-wall insulating film 113 including the silicon nitride film or silicon oxide film is provided.

Between each of the cell gates 104 and on the cell gate 104, an insulating film 110 between cells is provided. Here, the insulating film 110 between cells includes the gate insulating film 105 extended on the n-type silicon layer 103 between the cell gates 104 and a buried insulating film 109 provided between the cell gates 104 and on the cell gate 104.

In a part of the insulating film 109 between the cell gates 104, a carbon accumulation region 111 including the carbon element having a high concentration is provided. The carbon element in the carbon accumulation region 111 is combined to the silicon element to become a positive fixed charge. In the carbon accumulation region 111, similarly to the first embodiment, as illustrated in FIG. 2, the concentration is the maximum on an interface of the n-type silicon layer 103 and gradually decreasing toward a height direction of the cell gate 104. In the height direction of the cell gate 104, a region of the insulating film 110 between cells within 2 nm from a main surface of the n-type silicon layer 103 includes a part of the maximum concentration of the carbon, and the area density of the carbon element in the carbon accumulation region 111 is set to about $1\times10^{12}$ to $1\times10^{15}$ cm$^{-2}$ in the peak concentration region.

Further, the carbon accumulation region 111 is selectively provided in the region of the insulating film 110 between cells between the cell gates 104 in the channel length direction. Furthermore, the space distribution of the carbon element in the carbon accumulation region 111 as illustrated in FIG. 14, the concentration of the carbon element is the maximum at the center portion of the cell gates 104 and gradually decreased towards the cell gate 104. A region beneath the cell gate 104 is provided such that the carbon element hardly exists.

Further, in the present embodiment, it is preferred that the dopant concentration in the n-type silicon layer 103 is $1\times10^{20}$ cm$^{-3}$ or lower. This is because, when the dopant concentration in the n-type silicon layer 103 is as low as $1\times10^{20}$ cm$^{-3}$ or lower, the effects of increasing the concentration of the carriers in the n-type silicon layer 103 is large owing to the existing carbon element, however, when the dopant concentration is $1\times10^{20}$ cm$^{-3}$ or higher, the effects are not very large, thus, when a great amount of carbon element unnecessarily exists in a peripheral region, a mobility of the carriers flowing in the channel is decreased by Coulomb scattering caused by the positive charges, and the cell current can be adversely decreased.

The NAND-type non-volatile semiconductor memory having the structure as described above can be obtained by implementing the processes except for the process for forming the n-type diffusion layer in the fabrication method of the third embodiment. According to the present embodiment, the gate side-wall insulating film 113 is provided on the side surfaces of the cell gate 104 to block the carbons from entering beneath the cell gate 104 when the carbon element is introduced by the ion implantation or thermal diffusion. However, when the memory does not need a high reliability, the gate side-wall insulating film 113 may not be necessarily provided. Even in this case, the carrier concentration in the n-type semiconductor layer can be also increased to increase the cell current.

According to the embodiment, in addition to the obtained effects similar to the third embodiment, since the SOI substrate is used, a parasitic capacity can be decreased to realize an operation at high speed. Further, power consumption can be saved compared to a usual silicon substrate. Furthermore, when the SOI substrate is used, a process for forming the diffusion layer can be omitted, resulting in simplifying a process for fabricating the element.

In the present embodiment, instead of the carbon accumulation region including the carbon element, the nitrogen accumulation region including the nitrogen element having a level of the concentration similar to that of the carbon element can be provided to obtain the effects of increasing the carrier concentration. However, since the nitrogen element can easily generate the charge trap level compared to the carbon element, when applied for the highly reliable memory, the carbon element may be preferably used.

Sixth Embodiment

Figure 18:
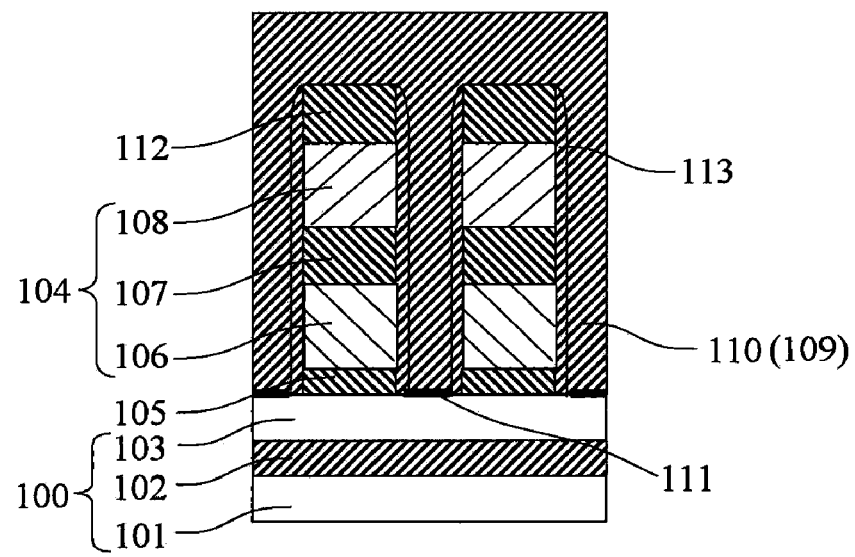
FIG. 18 is a sectional view of a structure of a semiconductor memory device according to a sixth embodiment of the present invention.

A sixth embodiment will be described. FIG. 18 is a cross-sectional view of the NAND-type non-volatile semiconductor memory according to the sixth embodiment of the present invention. The present embodiment has a structure where a part of the gate insulating film 105 extended between the cell gates 104 is removed from the NAND-type non-volatile semiconductor memory of the fifth embodiment. Since the materials and structures of the films other than the characteristics described above are similar to those of the first embodiment, the descriptions of the similar parts will be omitted here.

The NAND-type non-volatile semiconductor memory according to the present embodiment can be obtained by implementing the processes except for the process for forming the n-type diffusion layer in the fabrication method of the fourth embodiment. According to the present embodiment, the gate side-wall insulating film 113 is provided on the side surfaces of the cell gate 104 to block the carbons from entering beneath the cell gate 104 when the carbon element is introduced by the thermal diffusion. However, when the memory does not need a high reliability, the gate side-wall insulating film 113 may not be necessarily provided. Even in this case, the carrier concentration in the n-type semiconductor layer can be also increased to increase the cell current.

According to the embodiment, in addition to the obtained effects similar to the fourth embodiment, since the SOI substrate is used, a parasitic capacity can be decreased to realize an operation at high speed. Further, power consumption can be saved compared to a usual silicon substrate. Furthermore, when the SOI substrate is used, a process for forming the diffusion layer can be omitted, resulting in simplifying a process for fabricating the element.

In the present embodiment, instead of the carbon accumulation region including the carbon element, the nitrogen accumulation region including the nitrogen element having a level of the concentration similar to that of the carbon element can be provided to obtain the effects of increasing the carrier concentration. However, since the nitrogen element can easily generate the charge trap level compared to the carbon element, when applied for the highly reliable memory, the carbon element may be preferably used.

Seventh Embodiment

Figure 19:
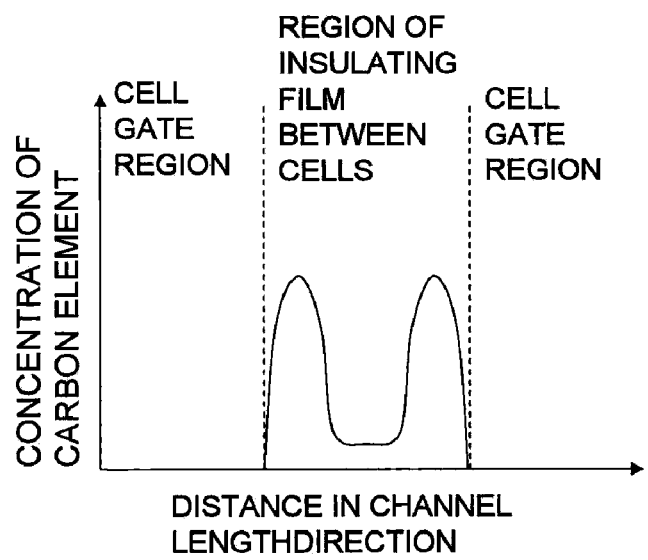
FIG. 19 is a space distribution diagram of the carbon element in the semiconductor memory device in a channel length direction according to a seventh embodiment of the present invention.
Figure 21:
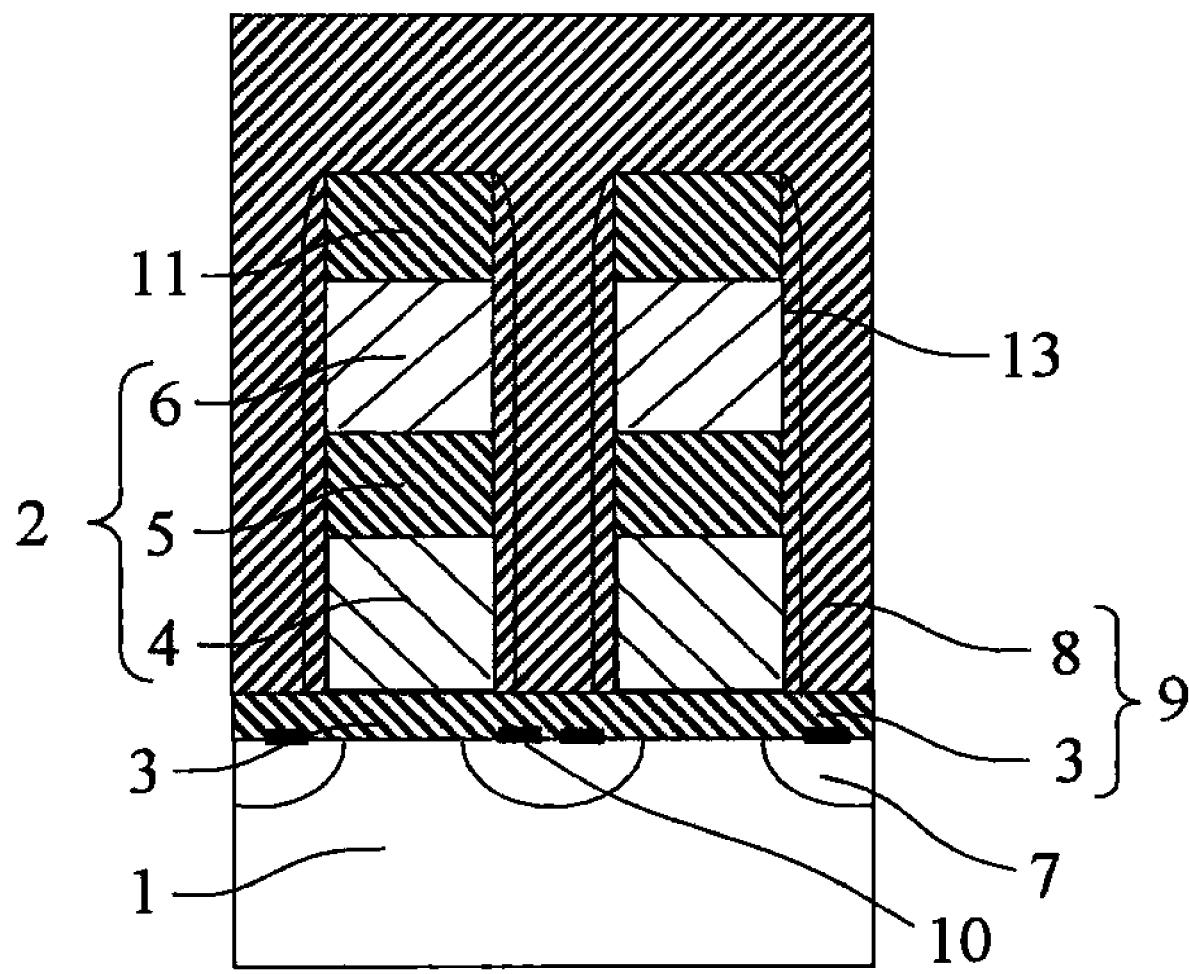
FIG. 21 is a sectional view showing a step subsequent to FIG. 20.

FIG. 19 illustrates the space distribution of the carbon accumulation region in the channel length direction in the NAND-type non-volatile semiconductor memory according to a seventh embodiment of the present invention. Except for the different space distribution of the carbon element in the channel length direction of the third embodiment, the present embodiment has a structure similar to those of the third embodiment as illustrated in FIG. 21, and also the space distribution of the carbon concentration in the cell gate height direction similar to those of the third embodiment as illustrated in FIG. 2. The same reference numerals are given to the parts similar to those in the third embodiment, and the descriptions thereof will be omitted.

According to the present embodiment, the carbon accumulation region 10 is provided in the part of the insulating film 9 between the cell gates 2. The space distribution of the concentration of the carbon element in the carbon accumulation region 10 in the channel length direction has the maximum concentration at both peripheral portions of the center portion in the channel and the minimum concentration at the center portion in the channel length direction between the cell gates 2 as illustrated in FIG. 19.

This arrangement can prevent a channel current conductance directly beneath a peripheral region of the insulating film 9 between the cells from being decreased and realize the memory operation in a high speed. That is, in the peripheral region of the insulating film 9 between the cells, a great amount of the charge trap is generated when the memory cell writing/erasing is operated, thereby the mobility of the channel carriers is decreased. However, a great amount of the positive charge in a part of the peripheral region can increase the concentration of the carriers at an edge portion of the n-type diffusion layer 7, thereby ensuring a desired amount of the channel current.

Compared to the NAND-type non-volatile semiconductor memory according to the first embodiment described above, the NAND-type non-volatile semiconductor memory according to the present embodiment, has a disadvantage of reliability such as an ensured number of writing/erasing operations, but an advantage of the memory operation at a high speed.

According to the present invention, it is preferred that the dopant concentration in the n-type diffusion layer 7 is $1 \times 10^{20}$ cm$^{-3}$ or lower. This is because, when the dopant concentration in the n-type diffusion layer 7 is as low as $1 \times 10^{20}$ cm$^{-3}$ or lower, the effects of increasing the concentration of the carriers in the n-type diffusion layer 7 is large owing to the existing carbon element, however, when the dopant concentration is $1 \times 10^{20}$ cm$^{-3}$ or higher, the effects of increasing the concentration of the carriers is not very large, thus, when a great amount of carbon element unnecessarily exist in the peripheral region, a mobility of the carriers flowing in the channel is decreased by Coulomb scattering caused by the positive charge, and the cell current can be adversely decreased.

The fabrication method of the NAND-type non-volatile semiconductor memory having the above described structure will be described referring to FIGS. 20 and 21. First, similarly to the fabrication method of the third embodiment described above, the n-type diffusion layer 7 is formed by the ion implantation method and thermal annealing, using the cell gate 2 as a mask illustrated in FIG. 5 to form the insulating film 13 on the gate side wall, which is the same process as that of the third embodiment.

Figure 20:
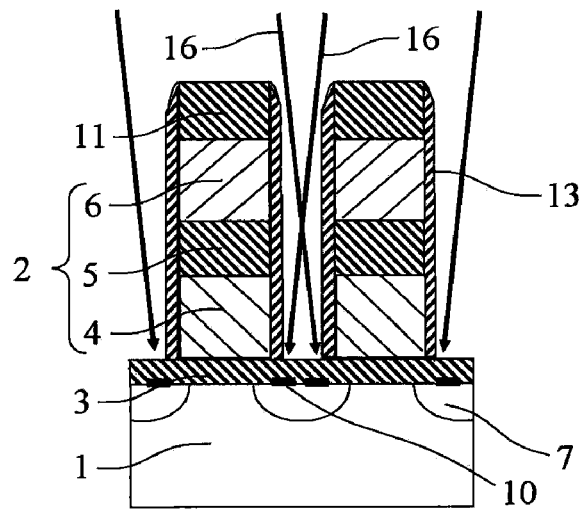
FIG. 20 is a sectional view schematically illustrating a part of a method for fabricating the semiconductor memory device according to the seventh embodiment of the present invention.

As illustrated in FIG. 20, using the adjacent cell gate 2 as a mask, tilted (oblique) ion implantation 16 is performed. In the channel length direction, the tilted ion implantation 16 can introduce the carbon element in a higher concentration in both the peripheral regions compared to the center region in the part of the insulating film 9 between the cells. After the ion implantation, the carbon element can be thermal diffused by annealing and eccentrically located such that the concentration is the maximum on the interface between the gate insulating film 3 between the cell gates 2 and the n-type diffusion layer 7 to form the carbon accumulation region 10.

As illustrated in FIG. 21, the buried insulating film 8 including the silicon oxide film is formed using the plasma CVD method or spin-coating method, and the insulating film 9 between the cells including the gate insulating film 3 extended between the cell gates 2 and the buried insulating film 8 is formed. Subsequently, using the known technology, the wiring layer (not illustrated) is formed so that the non-volatile semiconductor memory cell can be obtained.

According to the present embodiment described above, the effects similar to those of the third embodiment can be obtained. Further, the dopant concentration in the n-type diffusion layer is set to as low as $1 \times 10^{20}$ cm$^{-3}$ or lower, and the concentration in the carbon accumulation region 10 is set to low in the channel length direction between the cell gates 2 at the center portion and the maximum at both the peripheral portions thereof. Accordingly, the concentration of the carriers is increased at the edge portion of the n-type diffusion layer 7, where the current is increased. Thus, a great number of carriers pass through the peripheral regions of the insulating film 9 between the cells when the memory cell writing/erasing is operated such that the memory operation error can be prevented.

According to the present embodiment, the insulating film 13 on the gate side wall is provided on the side surfaces of the cell gate 2 such that the carbon can be blocked from entering beneath the cell gate 2 when the carbon ions are introduced. However, when the memory does not need a high reliability, the gate side-wall insulating film 13 may not be necessarily provided. Even in this case, the carrier concentration in the n-type diffusion layer can be also increased to increase the cell current. On the other hand, when the memory reliability needs to be increased, a thickness of the film of the insulating film 13 on the gate side wall may be increased to decrease the concentration of the carbon in the peripheral regions of the insulating film 9 between the cells. Further, in the present embodiment, the similar effects can be obtained by using the SOI substrate instead of the silicon substrate.

Further, instead of the carbon accumulation region including the carbon element, the nitrogen accumulation region including the nitrogen element having a level of the concentration similar to that of the carbon element can be provided to obtain the effects of increasing the carrier concentration. When the nitrogen element is introduced, since nitrogen element has a shorter range than that of the carbon ions, slightly higher acceleration energy than that for the carbon ions is preferably set.

What is claimed is:

1. A semiconductor memory device comprising:
    a substrate having a semiconductor layer;
    an n-type semiconductor region formed beneath a main surface of the semiconductor layer;
    a plurality of cell gates being aligned at a space from each other and including a gate insulating film formed on the main surface of the semiconductor layer, a charge storage layer formed on the gate insulating film, a charge block layer formed on the charge storage layer and a control gate electrode formed on the charge block layer;
    an insulating film between cells formed on the main surface of the semiconductor layer between the cell gates next to each other, the insulating film between the cells insulating one cell gate from the other cell gate; and
    a carbon accumulation region formed in the insulating film between the cells and having a maximum concentration of a carbon element in a region within 2 nm from an interface between the semiconductor layer and the insulating film between the cells.

2. The semiconductor memory device according to claim 1, wherein a dopant concentration in the n-type semiconductor region is $1\times10^{20}$ cm$^{-3}$ or lower.

3. The semiconductor memory device according to claim 1, wherein a maximum concentration of the carbon element is $1\times10^{12}$ to $1\times10^{15}$ cm$^{-2}$.

4. The semiconductor memory device according to claim 1, wherein the concentration of the carbon element at peripheral regions at both sides of a center region in the insulating film between the cells in a channel length direction is higher than the concentration at the center region in the insulating film between the cells.

5. The semiconductor memory device according to claim 1, wherein the substrate is an SOI substrate which includes the semiconductor layer provided on a semiconductor base via an insulating layer.

6. The semiconductor memory device according to claim 1, wherein a concentration of the carbon element at a center region in the insulating film between the cells in a channel length direction is higher than the concentration at peripheral regions at both sides of the center region.

7. The semiconductor memory device according to claim 6, wherein the concentration of the carbon element at the peripheral region is 1/10 or lower of the concentration of the carbon element at the center region.

8. The semiconductor memory device according to claim 3, wherein a space between the cell gates is 30 to 100 nm.

9. The semiconductor memory device according to claim 1, wherein the gate insulating film is also formed on the main surface of the semiconductor layer between the cell gates, the insulating film between the cell gates including the gate insulating film and a buried insulating film that is buried between the cell gates.

10. The semiconductor memory device according to claim 1, further including a gate side wall insulating film formed on a side surface of the cell gate.

* * * * *